United States Patent
Ebinuma

[11] Patent Number: 6,040,893
[45] Date of Patent: Mar. 21, 2000

[54] SCANNING EXPOSURE METHOD AND APPARATUS FOR CONTROLLING ACCELERATION AND DECELERATION OF A MASKING DEVICE

[75] Inventor: Ryuichi Ebinuma, Tokyo, Japan

[73] Assignee: Canon Kabushiki Kaisha, Tokyo, Japan

[21] Appl. No.: 08/935,902

[22] Filed: Sep. 23, 1997

[30] Foreign Application Priority Data

Sep. 25, 1996 [JP] Japan .................................. 8-272886

[51] Int. Cl.$^7$ .......................... G03B 27/42; G03B 27/54; G03B 27/72
[52] U.S. Cl. ................. 355/53; 355/67; 355/71
[58] Field of Search ................. 355/53, 71, 67, 355/55, 35

[56] References Cited

U.S. PATENT DOCUMENTS

| | | | |
|---|---|---|---|
| 5,123,036 | 6/1992 | Uno et al. | 378/34 |
| 5,125,014 | 6/1992 | Watanabe et al. | 378/34 |
| 5,172,402 | 12/1992 | Mizusawa et al. | 378/34 |
| 5,194,893 | 3/1993 | Nishi | 355/53 |
| 5,281,996 | 1/1994 | Bruning et al. | 355/77 |
| 5,317,615 | 5/1994 | Ebinuma et al. | 378/34 |
| 5,347,561 | 9/1994 | Ebinuma | 378/34 |
| 5,377,251 | 12/1994 | Mizusawa et al. | 378/34 |
| 5,473,410 | 12/1995 | Nishi | 355/53 |
| 5,486,896 | 1/1996 | Hazama et al. | 355/71 |
| 5,591,958 | 1/1997 | Nishi et al. | 355/71 |
| 5,686,997 | 11/1997 | Shirasu | 355/53 |
| 5,854,671 | 12/1998 | Nishi | 355/53 |

FOREIGN PATENT DOCUMENTS

| | | |
|---|---|---|
| 0 614 124 | 9/1994 | European Pat. Off. . |
| 0 633 506 | 1/1995 | European Pat. Off. . |
| 8-55796 | 2/1996 | Japan . |

Primary Examiner—David M. Gray
Assistant Examiner—Peter B. Kim
Attorney, Agent, or Firm—Fitzpatrick, Cella, Harper & Scinto

[57] ABSTRACT

A scanning exposure apparatus for projecting a portion of a pattern of an original onto a substrate in a slit-like shape through a projection optical system and for scanningly moving the original and the substrate perpendicular to an optical axis of the projection optical system, to thereby print the pattern of the original on the substrate. The apparatus includes a masking device for restricting an exposure area on the original, a drive device for moving the masking device in accordance with a scan of the original and the substrate and a controller for controlling the drive device so that acceleration of the masking device is completed before a start of the exposure and for initiating deceleration of the masking device after completion of the exposure.

4 Claims, 6 Drawing Sheets

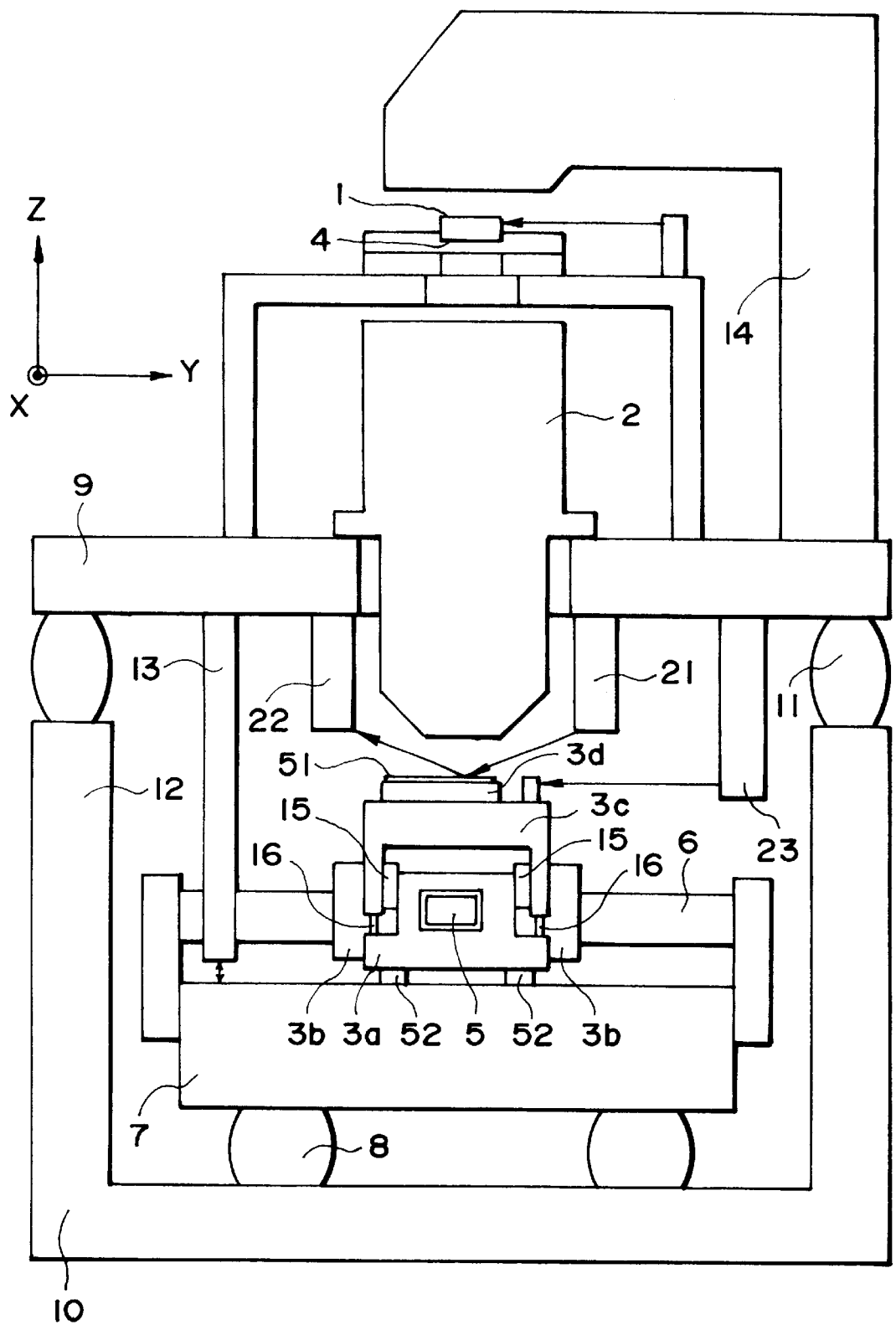
F I G. 1

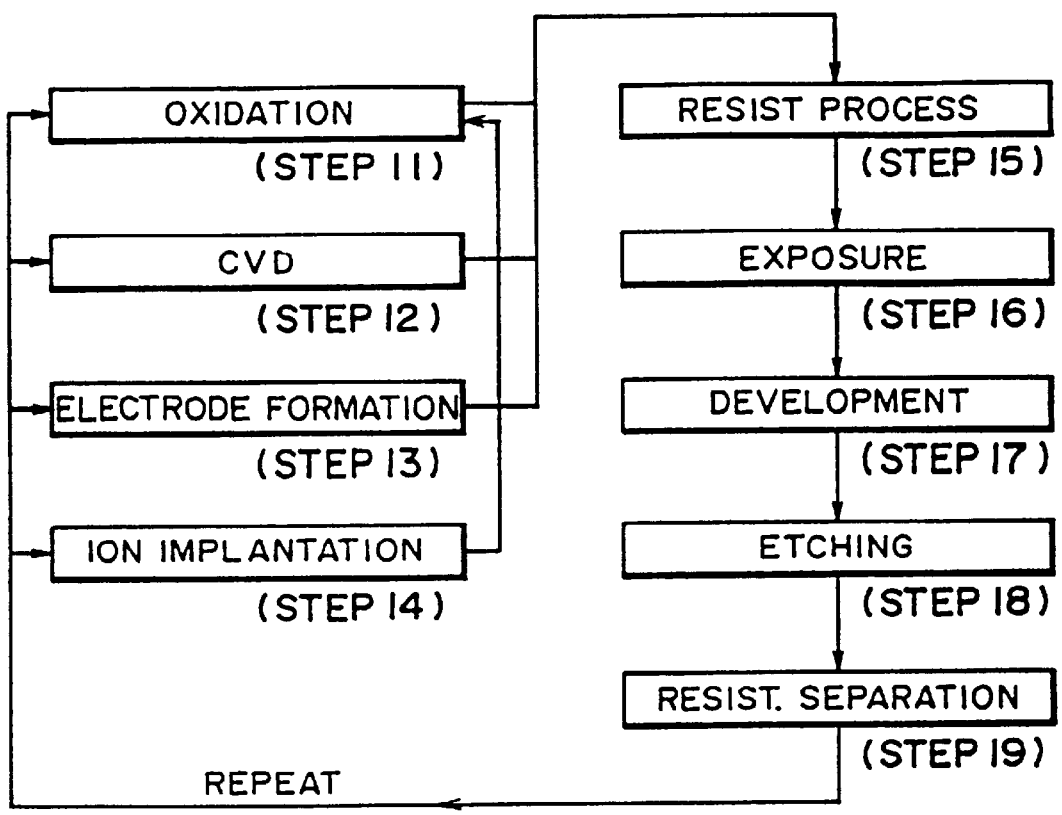
F I G. 7

SCANNING EXPOSURE METHOD AND APPARATUS FOR CONTROLLING ACCELERATION AND DECELERATION OF A MASKING DEVICE

FIELD OF THE INVENTION AND RELATED ART

This invention relates to an exposure apparatus usable in the manufacture of semiconductor devices, for example, for printing a design pattern on a resist provided on a substrate, and also to a device manufacturing method for use with such an exposure apparatus.

In an exposure apparatus according to a simultaneous exposure method, if a projection optical system is provided by lenses, the imaging region thereof has a circular shape. However, since a semiconductor integrated circuit is generally of a rectangular shape, the pattern transfer region in the case of the simultaneous exposure method has to be of a rectangular shape inscribed within the circular imaging region of the projection optical system. Thus, even the largest pattern transfer region is of a square shape with a side $1/\sqrt{2}$ of the diameter of the circle.

On the other hand, there has been proposed a scan exposure method (step-and-scan method) wherein a slit-like exposure region of a size approximately corresponding to the diameter of a circular imaging region of a projection optical system is used and wherein a reticle and a wafer are scanningly moved in synchronism with each other, whereby the pattern transfer region is enlarged. In this method, with a projection optical system having an imaging region of the same size, a larger pattern transfer region can be attained as compared with the step-and-repeat method, wherein for each pattern transfer region, simultaneous exposure is performed by use of a projection lens. More specifically, with respect to the scan direction, there is no limitation by the optical system and, therefore, a pattern transfer region corresponding to the stroke of the stage can be provided. Also, with respect to a direction perpendicular to the scan direction, a pattern transfer region of about $\sqrt{2}$ times larger can be provided.

In exposure apparatuses for the manufacture of semiconductor integrated circuits, enlargement of the pattern transfer region and improvement of the resolution are desired to meet production of larger capacity chips. The capability of using a smaller projection optical system is advantageous in with respect to optical performance and cost. Thus, a step-and-scan exposure method is very attractive.

Exposure apparatuses include masking means for masking a test pattern provided on a reticle. The masking means comprises a blade which is disposed on a plane optically conjugate with the reticle surface. In scanning exposure apparatuses, because of scanning movement of the reticle and the wafer, such a blade has to be moved in synchronism with the scan movement. However, if the masking means moves fully in synchronism with the reticle, it is required to scan the masking means by the same distance (for example, 37.5 mm) as the reticle. Thus, there are inconveniences in relation to the masking means such as large weight, large consumption of electrical power, large cost, and the like.

Japanese Laid-Open Patent Application, Laid-Open No. 55796/1996 shows an arrangement wherein masking means is kept closed before a start of scan and, in response to the start of the scan, it is moved in synchronism with a reticle and is opened up to an exposure slit width. The masking means is stopped there and, just before completion of the scan, it starts movement in synchronism with the reticle. The exposure slit is closed when the scan is completed. The stroke (scan distance) of this masking means is small, like the width of the exposure slit.

However, there is still a possibility that acceleration or deceleration of the masking means during the scan exposure causes vibration, which adversely affects synchronous scan control and thus, the exposure precision.

SUMMARY OF THE INVENTION

It is an object of the present invention to provide a reduced stage stroke for masking means without adversely affecting synchronous scan control of an original and a workpiece substrate.

In accordance with an aspect of the present invention, there is provided a scanning exposure apparatus for projecting a portion of a pattern of an original onto a substrate in a slit-like shape through a projection optical system and for scanningly moving the original and the substrate perpendicular to an optical axis of said projection optical system, to thereby print the pattern of the original on the substrate, said apparatus comprising: masking means for restricting exposure with slit-like light; driving means for moving said masking means in accordance with a scan of the original and the substrate; and control means for controlling said driving means so that acceleration of said masking means is completed before a start of the exposure and for initiating deceleration of said masking means after completion of the exposure.

Preferably, said control means controls said driving means so that acceleration of said masking means is completed after completion of acceleration of one of the original and the substrate for scan exposure.

With this structure, the exposure process is not performed during acceleration or deceleration of the masking means. Thus, no adverse effect is applied to synchronous scan control of the original and the substrate. Further, the applicant has found that the masking means may have a synchronous error larger than the synchronous error of the original and the substrate. On the basis of this finding, while for a scan of the reticle for each stage of acceleration, rectification, exposure, idle movement and deceleration for the reticle needs a stroke (for example, if the exposure stroke is 32.5 mm, the total stroke will be 37.5 mm), the masking means may have a larger synchronous error and, therefore, the rectification period can be shortened. Additionally, acceleration and deceleration may be enlarged. This enables shortening the strokes for acceleration, deceleration and rectification, and assures shortening of the total stroke.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic and side view of a scanning exposure apparatus according to an embodiment of the present invention.

FIG. 7 is a flow chart for explaining details of a wafer process in the procedure of FIG. 6.

DESCRIPTION OF THE PREFERRED EMBODIMENTS

Figure 2:
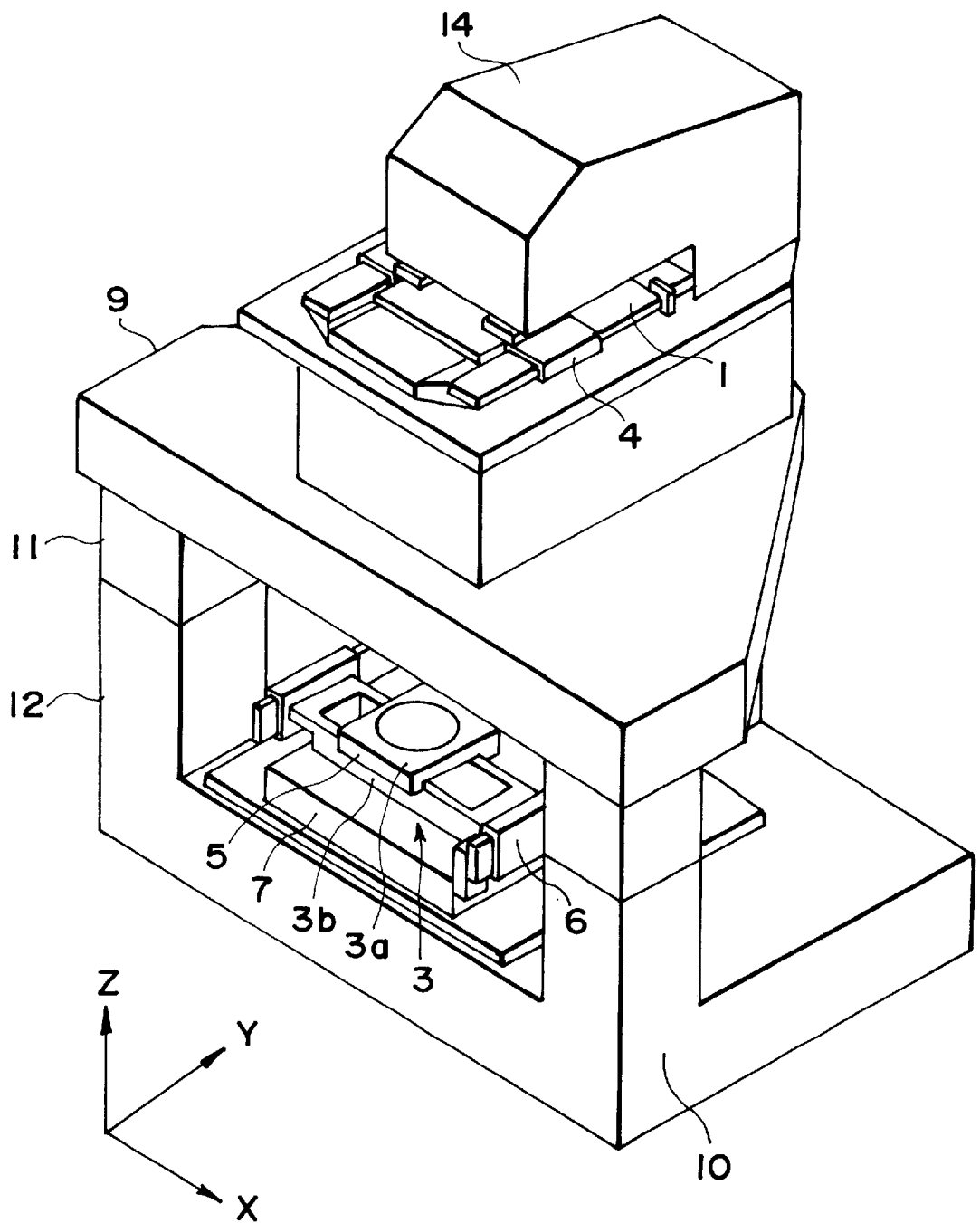
FIG. 2 is a schematic and perspective view of the exposure apparatus of FIG. 1.

Preferred embodiments of the present invention will be described with reference to the drawings. FIG. 1 is a schematic and side view of an exposure apparatus according to an embodiment of the present invention. FIG. 2 is a schematic and perspective view of this exposure apparatus.

As shown in these drawings, the exposure apparatus comprises a step-and-scan type exposure apparatus wherein a portion of a pattern of an original placed on a reticle stage 1 is projected onto a wafer placed on a wafer stage 3 through a projection optical system 2, wherein the reticle and the wafer are relatively and scanningly moved in synchronism with each other in the Y direction relative to the projection optical system 2, whereby the pattern of the reticle is transferred to the wafer, and wherein there is stepwise motion interposed to repeat the scan exposure to plural regions (shots) on the wafer.

The reticle stage 1 can be moved in the Y direction by a linear motor 4. The wafer stage 3 comprises an X stage 3a which can be moved in the X direction by a linear motor 5. The wafer stage further comprises a Y stage 3b which can be moved in the Y direction by a linear motor 6. A synchronized scan of the reticle and the wafer is performed by moving the reticle stage 1 and the Y stage 3b in the Y direction at a predetermined speed ratio (e.g., 4:–1 where the sign "–" represents that the direction is inverse). Stepwise motion in the X direction is provided by the X stage 3a. The X stage 3a is guided in the X direction by means of an air bearing assembly 52 along a stage base 7, while being confined with respect to the Z direction. There is a Z-tilt stage 3c which can be moved relative to the X stage 3a, in the Z-tilt direction by plural linear motors 15. Disposed between the Z-tilt stage 3c and the X stage 3a is a sensor 16 by which the relative position of them with respect to the Z-tilt direction is measured.

The wafer stage 3 is mounted on the stage base 7 which is supported by the floor, for example, at three points and through three dampers 8. The reticle stage 1 and the projection optical system 2 are mounted on a barrel base 9 which is supported by a base frame 10 mounted on the floor, for example, through three dampers 11 and pillars 12. Each damper 8 comprises an active damper for active vibration control or vibration isolation in six-axis directions. However, it may comprise a passive damper. Alternatively, the mechanism may be supported without such a damper.

The exposure apparatus further includes distance measuring means 13 such as a laser interferometer or micro-encoder, for example, which is adapted to measure the distance between the barrel base 9 and the stage base 7 at three points.

Light projecting means 21 and light receiving means 22 provide a focus sensor for detecting whether a wafer on the wafer stage 3 is positioned on the focus plane of the projection optical system 2 or not. More specifically, the light projecting means 21 fixed to the barrel base 9 projects light on to the wafer in oblique direction, and the light receiving means 22 detects the position of reflection light from the wafer to thereby detect the position of the wafer surface with respect to the optical axis direction of the projection optical system 2.

Mounted on the barrel base 9 is a frame 14 for housing therein a portion of illumination system means for illuminating an exposure region on the reticle. On the frame of this illumination means 14, a movable masking blade to be described later is mounted.

In operation with the structure described above, by use of conveying means (not shown) a wafer is conveyed along a conveyance path between two pillars 12 in the front portion of the apparatus. After completion of a predetermined alignment operation, the exposure apparatus performs printing of the pattern of the reticle onto plural exposure regions on the wafer while repeating scan exposure and stepwise motion. With regard to the scan exposure, the reticle stage 1 and the Y stage 3b are moved in the Y direction (scan direction) at a predetermined speed ratio so that the pattern of the reticle is scanned with slit-like exposure light, and also the wafer is scanned with the projected image thereof. By this, the pattern of the reticle is transferred and printed onto a particular exposure region on the wafer. During the scan exposure process, the height (level) of the wafer surface is measured by the focus sensor described above, and, on the basis of the measured value, the height and tilt of the wafer stage 3 are real-time controlled to execute focus correction. After scan exposure of one exposure region is completed, the X stage 3a is driven to move the wafer stepwise in the X direction to thereby place another exposure region at the scan exposure start position. Then, the scan exposure is performed. The layout of exposure regions, the scan direction (positive or negative) and the order of exposures for the exposure regions, for example, are so determined that, with the combination of stepwise motion in the X direction and movement in the Y direction for scan exposure, exposures can be done efficiently to plural exposure regions on the wafer.

Figure 3:
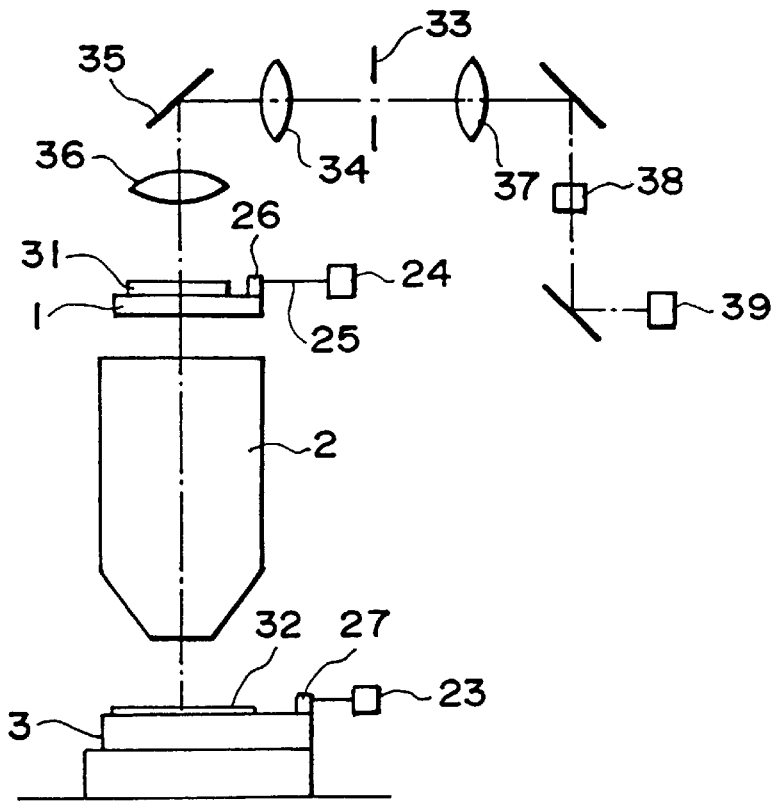
FIG. 3 is a schematic view for explaining an optical arrangement of the exposure apparatus of FIG. 1.

FIG. 3 illustrates details of the optical arrangement of the exposure apparatus off FIG. 1.

In the apparatus of FIG. 3, light emitted from a laser interferometer light source (not shown) is introduced into a Y-axis laser interferometer 24 for the reticle stage. The light thus introduced into the Y-axis laser interferometer 24 is divided by a beam splitter (not shown) inside the interferometer 24 into light to be directed to a fixed mirror (not shown) in the interferometer 24 and light to be directed to a Y-axis movable mirror 26. The light directed to the Y-axis movable mirror 26 goes along a Y-axis measurement path 25 and impinges on the Y-axis movable mirror 26 which is fixedly mounted on the reticle stage 1. The light reflected there again goes along the Y-axis measurement path 25 back to the beam splitter within the interferometer 24, and it is superposed with the light reflected by the fixed mirror. By detecting a change in interference in the superposed light, the movement distance in the Y direction can be measured. The thus obtained movement distance information is fed back to a scan control device (not shown), and positioning control of the scan position of the reticle stage 1 is performed. As regards the Y stage 3b, similarly, positioning control of the scan position thereof is performed on the basis of the result of measurement through a Y-axis laser interferometer 23 for the wafer stage.

In FIG. 3, denoted at 1 is a reticle stage on which a reticle 31 is placed. Denoted at 2 is a projection optical system, and denoted at 3 is a wafer stage on which a wafer 32 is placed. Denoted at 23 is a Y-axis laser interferometer for the wafer stage, and denoted at 24 is a Y-axis laser interferometer for the reticle stage. Denoted at 25 is a Y-axis measurement light path, and denoted at 26 and 27 are Y-axis movable mirrors. Denoted at 33 is a movable masking blade, which is movable in the Y direction. Imaging lenses 34 and 36 as well as a mirror 35 provide a masking imaging system with which the masking blade 33 and the reticle 31 are placed in an optically conjugate relation. Since these components are disposed within the frame 14, any vibration produced during acceleration or deceleration of the masking blade 33 may be transmitted to them. There is an illumination system which comprises a unit including a lens 37, a secondary light source 38 and a light source 39, for example.

Figure 4A:
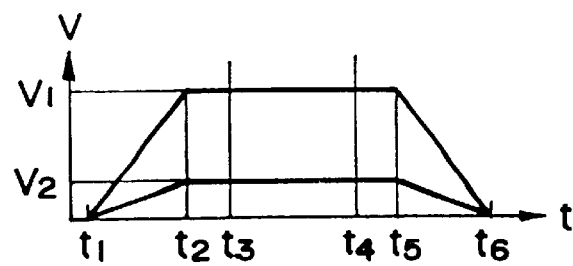
FIGS. 4A and 4B are time charts, respectively, for explaining scan movement of a reticle, a wafer and a masking blade, in the exposure apparatus of FIG. 1.
Figure 4B:
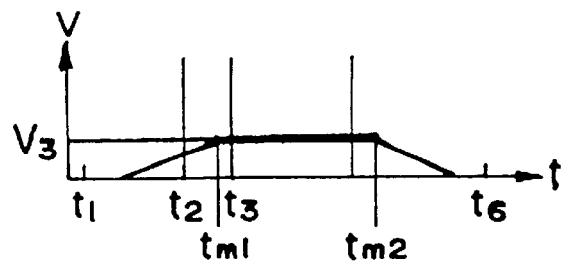

FIG. 4A is a time chart for explaining a scan of the reticle 31 and the wafer 32, and FIG. 4B is a time chart for explaining a scan of the masking blade 33. In FIGS. 4A and 4B, denoted at $t_1$ is a wafer (reticle) acceleration start point, and denoted at $t_2$ is an acceleration completion point. The period from point $t_2$ to point $t_3$ is a rectification (synchronization) period for rectifying vibration during acceleration of the wafer (reticle) and vibration to be produced by servo controlling, after the acceleration, the scan speed to a predetermined level. Point $t_3$ corresponds to an exposure start point, and point $t_4$ corresponds to an exposure completion point. Point $t_5$ corresponds to a deceleration start point, and point $t_6$ corresponds to a deceleration completion point. The period from point $t_4$ to point $t_5$ corresponds to idle movement period. It is unnecessary for the current shot, just having been exposed, but it provides a rectification period for a subsequent shot to be scanningly exposed in inverted direction. Denoted at $v_1$ is the scan speed of the reticle, and denoted at $v_2$ is the scan speed of the wafer. For example, $v_1$ may be 100 mm/sec. The scan speed $v_2$ is equal to the product of the speed $v_1$ as multiplied by the projection magnification. If the projection magnification is ¼, for example, then the wafer scan speed $v_2$ is 25 mm/sec. Point $t_{m1}$ corresponds to an acceleration completion point of the masking blade 33, and point $t_{m2}$ corresponds to a deceleration start point of the masking blade 33. As seen from FIGS. 4A and 4B, when relations $t_3 > t_{m1}$ and $t_{m2} > t_4$ are satisfied, an adverse effect of vibration caused during acceleration or deceleration of the masking blade 33 can be prevented from being applied to the exposure process. Further, when a relation $t_{m1} > t_2$ is satisfied, further reduction of the stroke of a masking stage to which the masking blade 33 is mounted is attainable. Denoted at $v_3$ is the scan speed of the masking blade 33, and it corresponds to a quotient of dividing the scan speed of the reticle 31 by the magnification of the masking imaging system. If, for example, the magnification of the masking imaging system is x2, then $v_3 = v_1/2 = 50$ mm/sec.

Figure 5:
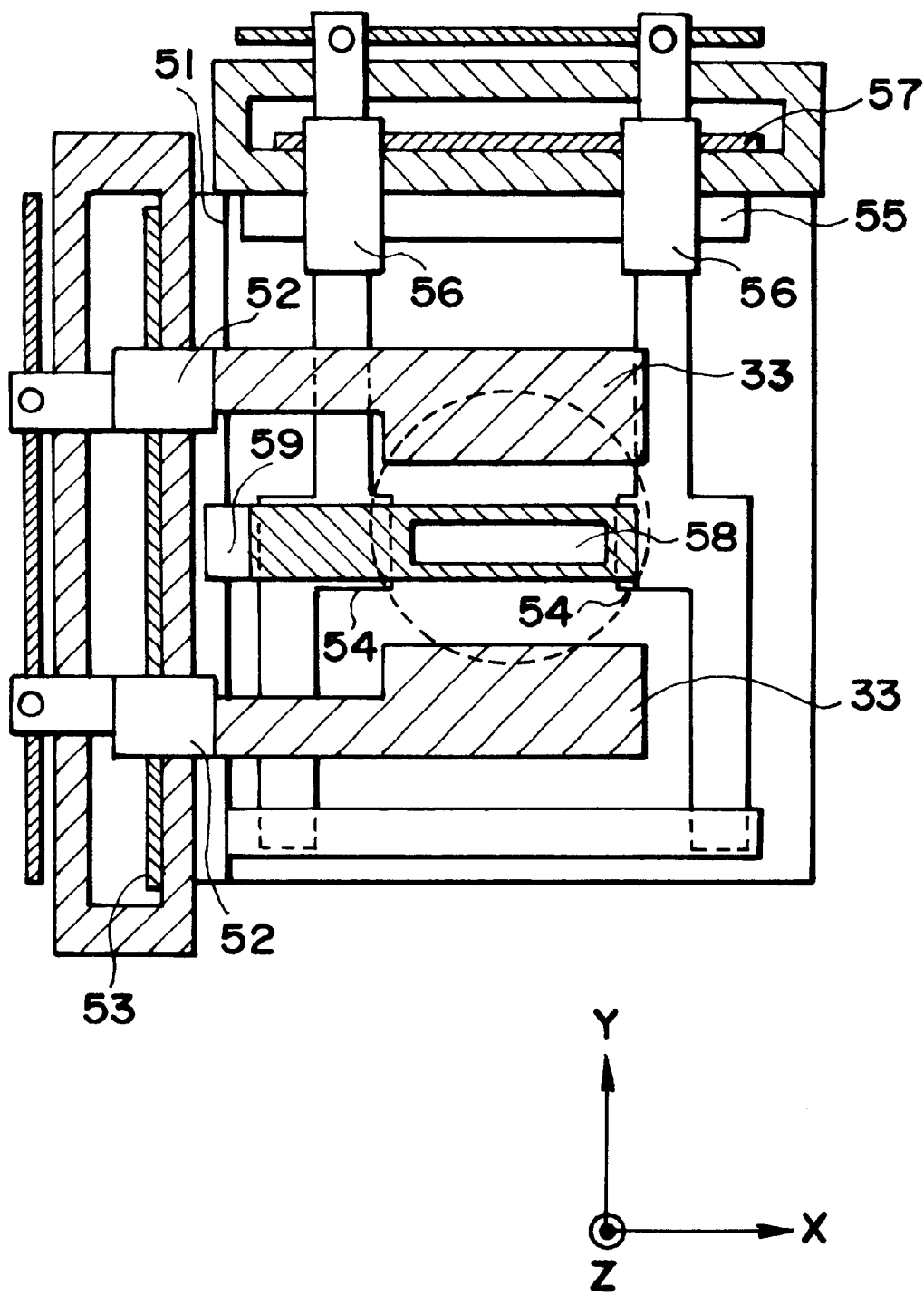
FIG. 5 is a schematic view for explaining details of a main portion of the masking blade, in the exposure apparatus of FIG. 1.

FIG. 5 shows details of the masking blade 33 as viewed from the left hand side in FIG. 3. In FIG. 5, denoted at 33 is a masking blade, and denoted at 51 is a masking guide for guiding the Y blade 33 in the Y direction. Denoted at 52 and 53 are a coil and a magnet, respectively, which provide a linear motor for moving the masking blade 33 along the Y guide 51. Denoted at 56 and 57 are a coil and a magnet, respectively, which provide a linear motor for moving an X blade 54 along an X guide 55. Denoted at 58 is a slit for passing a portion of exposure light, having been formed into a surface light source, from an exposure light source (not shown). The slit 58 serves to produce slit-like light to illuminate the reticle with the slit-like light. Denoted at 59 is a voice coil for moving the slit 58 in a direction (Z direction) perpendicular to the exposure optical axis. The slit 58 is shifted slightly in the Z direction, from a position which is optically conjugate with the reticle 32, such that the image of the slit 58 as formed on the reticle 32 is defocused. This provides a trapezoidal shape of an intensity profile of the slit exposure light.

Figure 6:
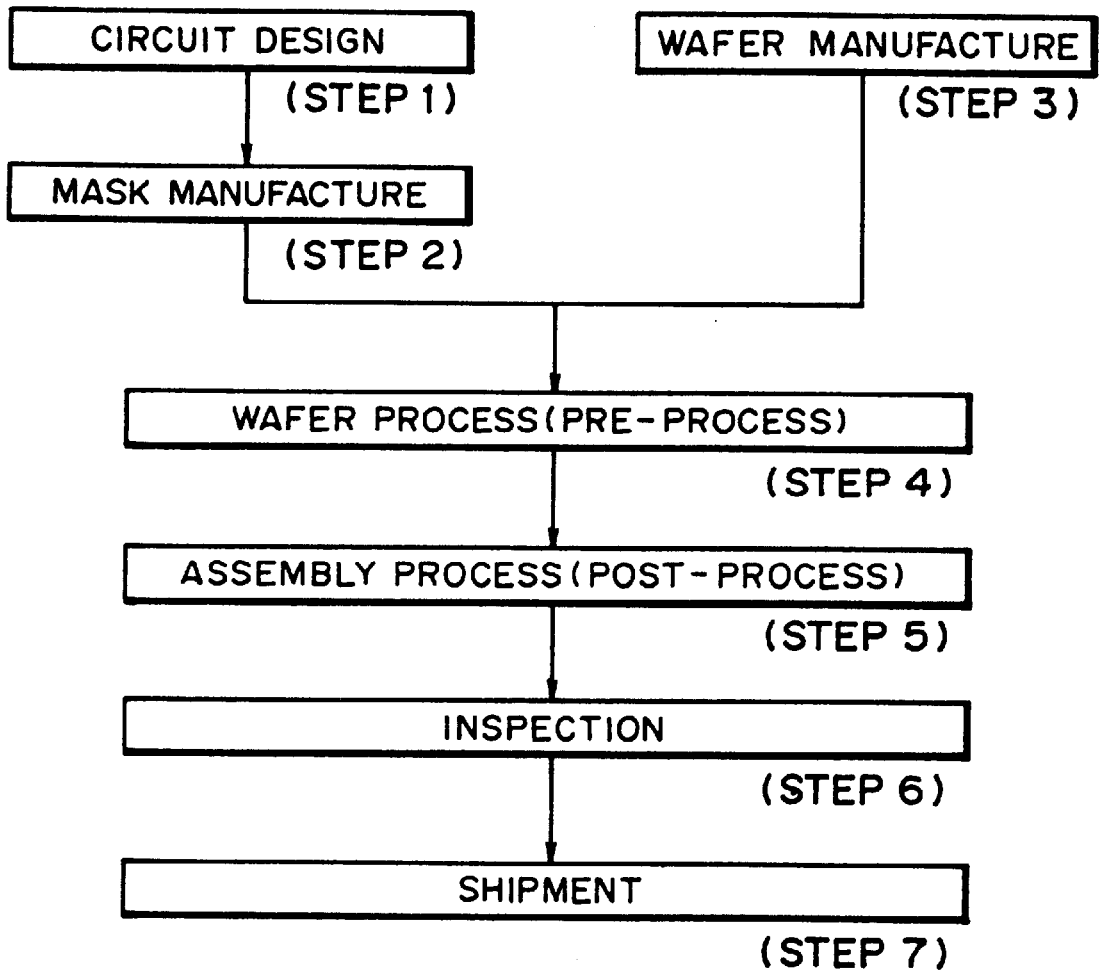
FIG. 6 is a flow chart of microdevice manufacturing processes.

FIG. 6 is a flow chart of a procedure for the manufacture of microdevices such as semiconductor chips (e.g., ICs or LSIs), liquid crystal panels, CCDs, thin film magnetic heads or micro-machines, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

FIG. 7 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured with reduced cost.

While the invention has been described with reference to the structures disclosed herein, it is not confined to the details set forth and this application is intended to cover such modifications or changes as may come within the purposes of the improvements or the scope of the following claims.

What is claimed is:

1. A scanning exposure apparatus for projecting a portion of a pattern of an original onto a substrate in a slit-like shape through a projection optical system and for scanningly moving the original and the substrate perpendicular to an optical axis of said projection optical system, to thereby print the pattern of the original on the substrate, said apparatus comprising:

masking means for restricting an exposure area on the original;

driving means for moving said masking means in accordance with a scan of the original and the substrate; and control means for controlling said driving means so that acceleration of said masking means is completed (i) before a start of the exposure and (ii) after completion of acceleration of one of the original and the substrate for scan exposure, and for initiating deceleration of said masking means after completion of the exposure.

2. A scanning exposure method, comprising the steps of:

restricting an exposure area on a substrate, with respect to slit-like light, by use of a masking blade; and moving the masking blade when the substrate is moved relative to the slit-like light for exposure thereof, wherein acceleration of the masking blade is completed (i) before a start of exposure of the substrate with the slit-like light and (ii) after completion of acceleration of the substrate, while deceleration of the masking blade is initiated after completion of the exposure of the substrate with the slit-like light.

3. A method according to claim 2, wherein, with the exposure of the substrate by moving the substrate relative to the slit-like light, a device pattern for manufacture of a device is printed on the substrate.

4. An apparatus according to claim 1, wherein said masking means moves at a constant speed during the exposure.

* * * * *

UNITED STATES PATENT AND TRADEMARK OFFICE
CERTIFICATE OF CORRECTION

PATENT NO. : 6,040,893
DATED : March 21, 2000
INVENTOR(S) : RYUICHI EBINUMA

It is certified that error appears in the above-identified patent and that said Letters Patent is hereby corrected as shown below:

COLUMN 1:
   Line 45, "in" should be deleted; and
   Line 62, "of scan" should read --of a scan--.

COLUMN 3:
   Line 66, "on to" should read --onto-- and "in" should read --in an--.

COLUMN 5:
   Line 26, "to" (second occurrence) should read --to an--.

Signed and Sealed this

Twenty-seventh Day of March, 2001

Attest:

NICHOLAS P. GODICI

Attesting Officer

Acting Director of the United States Patent and Trademark Office